United States Patent
Takenaka et al.

(10) Patent No.: US 8,211,494 B2
(45) Date of Patent: Jul. 3, 2012

(54) METHOD AND APPARATUS FOR MANUFACTURING CIRCUIT BOARD

(75) Inventors: Toshiaki Takenaka, Soraku-gun (JP); Toshikazu Kondou, Katano (JP); Yukihiro Hiraishi, Nishinomiya (JP); Kunio Kishimoto, Katano (JP)

(73) Assignee: Panasonic Corporation, Osaka (JP)

( * ) Notice: Subject to any disclaimer, the term of this patent is extended or adjusted under 35 U.S.C. 154(b) by 1895 days.

(21) Appl. No.: 10/540,606

(22) PCT Filed: Dec. 15, 2004

(86) PCT No.: PCT/JP2004/018693
§ 371 (c)(1),
(2), (4) Date: Jun. 27, 2005

(87) PCT Pub. No.: WO2005/065001
PCT Pub. Date: Jul. 14, 2005

(65) Prior Publication Data
US 2006/0115583 A1    Jun. 1, 2006

(30) Foreign Application Priority Data
Dec. 26, 2003   (JP) ................................. 2003-433147

(51) Int. Cl.
*B05D 5/12* (2006.01)
*B05D 3/12* (2006.01)

(52) U.S. Cl. ...... 427/97.7; 427/98.4; 427/282; 427/355; 427/356

(58) Field of Classification Search .................. 427/282, 427/355, 356
See application file for complete search history.

(56) References Cited

U.S. PATENT DOCUMENTS

| | | | | |
|---|---|---|---|---|
| 5,373,786 A | * | 12/1994 | Umaba | 101/127 |
| 6,497,991 B1 | | 12/2002 | Ishiguro | |
| 6,638,363 B2 | * | 10/2003 | Erdmann | 134/9 |
| 6,776,090 B2 | * | 8/2004 | Takenaka et al. | 101/127 |
| 6,814,804 B2 | * | 11/2004 | Onishi et al. | 118/213 |
| 7,105,277 B2 | * | 9/2006 | Takenaka et al. | 430/302 |

FOREIGN PATENT DOCUMENTS

| | | | |
|---|---|---|---|
| EP | 04 80 7052 | | 3/2009 |
| JP | 57-103862 U | | 6/1982 |
| JP | 57103862 | * | 6/1982 |
| JP | 05177811 A | * | 7/1993 |
| JP | 6-268345 A | | 9/1994 |
| JP | 7-106760 | | 4/1995 |
| JP | 2001-7514 A | | 1/2001 |
| JP | 2001007514 | * | 1/2001 |
| JP | 2001-213064 A | | 8/2001 |
| JP | 2001213064 | * | 8/2001 |
| JP | 2002-171060 A | | 6/2002 |
| JP | 2003-033967 A | | 2/2003 |

OTHER PUBLICATIONS

Japanese language International Search Report for PCT/JP2004/018693, dated Mar. 22, 2005.

* cited by examiner

*Primary Examiner* — Brian K Talbot
(74) *Attorney, Agent, or Firm* — RatnerPrestia

(57) ABSTRACT

A mask film, where squeegee cleaning part has been formed at a predetermined position, and another mask film are attached to both sides of a substrate. A through-hole is formed by using a laser, and conductive paste is filled into the through-hole by using a squeezing method. As discussed above, a paste-residue can be prevented on the through-hole, so that a circuit board having high quality of connection can be obtained.

26 Claims, 10 Drawing Sheets

Moving direction of the squeegee

METHOD AND APPARATUS FOR MANUFACTURING CIRCUIT BOARD

This application is a U.S. National Phase Application of PCT International Application PCT/JP2004/018693.

TECHNICAL FIELD

The present invention relates to a method and an apparatus for manufacturing a circuit board used in various electronic devices.

BACKGROUND ART

Recently, according to downsizing and high density of electronic devices, multilayer of a circuit board has been strongly demanded in a field of not only industrial use but also public use. A connecting method, by which circuit patterns of a plurality of layers are connected to each other through inner via-holes, and a structure having high reliability are necessary for the circuit board mentioned above. An example of the method for manufacturing the circuit board structured by using the inner via-hole connection with conductive paste is disclosed in Unexamined Japanese Patent Publication No. H6-268345 or No. H7-106760.

The conventional method for manufacturing a double-sided circuit board is described hereinafter. FIGS. 10A through 10F are sectional views showing steps of the conventional method for manufacturing the circuit board. FIG. 11 is a perspective view showing a conventional frame of a printing plate fixing a mask having an opening. FIG. 12 is a sectional view showing the conventional frame of the printing plate fixing the mask having the opening. FIGS. 13A through 13G are sectional views showing steps of filling paste by using a squeezing method. FIG. 14 is a partially sectional view of the conventional circuit board while the paste is filled. Prepreg sheet 21 shown in FIG. 10 has a size of 300 mm×500 mm and a thickness of approximately 150 μm. For example, a substrate formed of a composite, which is wholly aromatic polyamide fiber of nonwoven fabric impregnated with thermosetting epoxy resin, is used as prepreg sheet 21. Plastic film having a thickness of approximately 20 cm and a width of approximately 300 μm, for example polyethylene terephthalate (hereinafter referred to as "PET"), is used as mask films 22a and 22b. Si base mold-releasing layer not thicker than 0.01 μm is formed on a surface, which is bonded to prepreg sheet 21, of the mask film. A laminate apparatus is used for attaching prepreg sheet 21 to mask films 22a-22b. Mask films 22a and 22b are continuously bonded to prepreg sheet 21 by melting resin ingredient of prepreg sheet 21. Through-hole 23 is filled with conductive paste 24, thereby being electrically connected with metal foils 25a-25b which are copper or the like of a 35 μm thickness and attached to both sides of prepreg sheet 21.

The method for manufacturing the circuit board is described hereinafter. First, as shown in FIG. 10B, through-holes 23 are formed by using a laser processing method or the like at certain points of prepreg sheet 21 (FIG. 10A) whose both sides are bonded to mask films 22a and 22b.

Next, as shown in FIG. 10C, through-hole 23 is filled with conductive paste 24. A method for filling conductive paste 24 is described hereinafter. Prepreg sheet 21 including through-holes 23 is disposed on a stage of a general printing machine (not shown). By reciprocating two squeegees such as urethane rubber alternately, conductive paste 24 is filled directly from above mask film 22a. At this time, mask films 22a and 22b act as printing masks and prevention of pollution on surfaces of prepreg sheet 21.

The method for filling conductive paste 24 is further discussed hereinafter with reference to FIGS. 11, 12, and 13A-13G. A squeezing method is used for filling conductive paste 24. Because prepreg sheet 21 has particular mask films 22a and 22b, mask 32 made of stainless having a thickness of approximately 3 mm and forming opening 33 of 250 mm×450 mm larger than an effective area, in which paste is filled, of prepreg sheet 21 is fixed at frame 31 of printing plate 30 for filling as shown in FIGS. 11 and 12. First, as shown in FIG. 13A, mask 32 is set to prepreg sheet 21 disposed on stage 35 of the printing machine (not shown). The mask films are bonded to both sides of prepreg sheet 21, and through-hole 23 is formed.

Next, forward-squeegee 36a and backward-squeegee 36b capable of moving perpendicularly and horizontally, and pressing, have been disposed at an upper side of the printing machine. Only forward squeegee 36a descends to a certain position on mask 32 and pressed, so that conductive paste 24 is rolled and advanced.

Then, as shown in FIG. 13B, forward-squeegee 36a passes through slope part 34 of mask 32, and reaches an upper surface of prepreg sheet 21. Forward-squeegee 36a and backward-squeegee 36b have functions capable of moving perpendicularly and freely with respect to a position with keeping pressure.

Next, as shown in FIG. 13C, forward-squeegee 36a passes through the upper surface of prepreg sheet 21 and a slope part of mask 32, and stops at a predetermined position. After that, forward-squeegee 36a ascends, so that conductive paste 24 is dropped naturally.

Then, as shown in FIG. 13D, only backward-squeegee 36b descends to a certain position on mask 32. After that, as shown in FIGS. 13E through 13G, backward-squeegee 36b passes through mask 32 and the upper surface of prepreg sheet 21, so that a process of filling conductive paste 24 into through-hole 23 is finished.

Further, as shown in FIG. 10D, mask films 22a and 22b are peeled from the both sides of prepreg sheet 21. Next, as shown in FIG. 10E, metal foils 25a and 25b such as copper are piled at the both sides of prepreg sheet 21. By heating and pressing with a heat press in this state, as shown in FIG. 10F, prepreg sheet 21 is compressed in thickness (t2=approximately 100 μm) and prepreg sheet 21 and metal foils 25a-25b are bonded to each other. As discussed above, metal foils 25a and 25b at both sides are electrically coupled with each other by using conductive paste 24 filled in through-holes 23 formed at a certain position. Furthermore, metal foils 25a and 25b at both sides are etched selectively, so that circuit patterns (not shown) are formed and the double-sided circuit board can be obtained.

Next, problems of the conventional paste-filling method mentioned above are described hereinafter with reference to FIG. 14. In starting of printing, in a case of high viscosity of conductive paste 24, when squeegee 36b descends slope part 34 of mask 32, conductive paste 24 is pressed to a surface of prepreg sheet 21, so that resin ingredient is pushed out of paste around an edge of squeegee 36b. Therefore, conductive paste 24 having high viscosity adheres to the mask film by whole edge of squeegee 36b. When this adhered conductive paste 24 passes through through-hole 23 formed at prepreg sheet 21, solid paste tends to remain on through-hole 23 which is the first through-hole in a moving direction of the squeegee. Particularly it is revealed at whole width, where paste is filled, of squeegee 36b. Particularly, as shown in FIG.

15, in a case where the mask film has a thickness of 20 μm and a diameter of through-hole 23 is not larger than 150 μm, when mask films 22a and 22b are peeled, a part of conductive paste 24 is removed to a side of mask films 22a. As a result, conductive paste 24 in through-hole 23 becomes insufficient, so that there is a possibility that quality of connection is adversely affected.

SUMMARY OF THE INVENTION

The present invention provides a method for manufacturing a circuit board including:
attaching a mask film, where a squeegee cleaning part is formed at a predetermined position, to a substrate;
forming a through-hole at the substrate; and
filling conductive paste into the through-hole by using a squeezing method.

Furthermore the present invention provides an apparatus for manufacturing a circuit board including:
a transporting means for transporting a substrate;
supplying means, which are placed above and below the transporting means, for supplying mask films;
a laminate roll; and
a groove processing section, which is placed behind the laminate roll and above the transporting means, for processing a groove at the mask film.

Figure 1A:
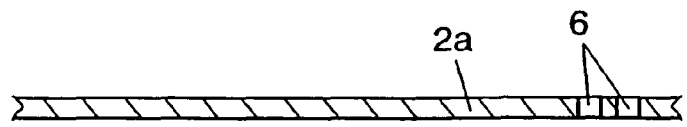
FIG. 1A is a sectional view showing a step of a method for manufacturing a circuit board in accordance with a first exemplary embodiment of the present invention.

REFERENCE MARKS IN THE DRAWINGS 1, 21 prepreg sheet
2a, 2b, 22a, 22b mask film
3, 23 through-hole
4, 24 conductive paste 6 squeegee cleaning part
7 swollen portion
8 laminate roll
9 groove processing section
10 blade-fixing-section-installing unit
11 sliding section
12 blade-fixing section
13 blade
14 blade-fixing screw
15 paste-filling area
16 product area
25a, 25b metal foil
30 printing plate
31 frame
32 mask
33 opening
34 slope part
35 stage
36a forward-squeegee
36b backward-squeegee

DETAILED DESCRIPTION OF THE PREFERRED EMBODIMENTS

A method for manufacturing and printing a circuit board of the present invention are described hereinafter. At a position of an unnecessary part of a product area or an outside of the product area of a paste-filling area of a mask film and within a printing range, linear or hound's-tooth no-penetrated-holes or hound's-tooth through-holes, whose surroundings are swollen by using a laser processing method, or a squeegee cleaning part, which is formed of a linear or hound's-tooth no-penetrated groove by using a cutting edge, is formed. After that, the mask film having the paste-filling area and an opposite mask film are bonded to both sides of a substrate, so that a through-hole is formed and then paste is filled.

Another method for manufacturing and printing a circuit board of the present invention are described hereinafter. Mask films are attached to both sides of a substrate. After that, at a position of an unnecessary part of a product area or an outside of the product area of a paste-filling area of a mask film and within a printing range, linear or hound's-tooth no-penetrated-holes or hound's-tooth through-holes, whose surroundings are swollen by using a laser processing method, or a squeegee cleaning part, which is formed of a linear or hound's-tooth no-penetrated groove by using a cutting edge, is formed. Then paste is filled.

Using the method discussed above, high viscous paste of a squeegee edge part is removed at the cleaning part before paste is filled in through-holes in a product. Therefore, solid paste is not remained at the through-holes in the product. Thus, when the mask films are peeled, possibility that a part of the paste is removed to a side of the mask films and quality of connection is adversely affected can be reduced. As a result, the method for manufacturing the circuit board having high quality of paste-filling is provided. In addition, in order to realize this easily, the apparatus for manufacturing the circuit board is provided.

Exemplary embodiments of the present invention are demonstrated hereinafter with reference to the accompanying drawings. It is emphasized that the drawings are schematic drawings and do not show actual dimensional relations between respective elements. In these drawings, the elements similar to those in drawings have the same reference marks, and the detailed descriptions of those elements are omitted here.

First Exemplary Embodiment

First exemplary embodiment is demonstrated with reference to FIG. 1 through FIG. 5. Prepreg sheet 1 has a size of 300 mm×500 mm and a thickness of approximately 150 µm. A substrate is formed of a composite which is wholly aromatic polyamide fiber of nonwoven fabric impregnated with thermosetting epoxy resin. PET having a thickness of approximately 20 µm and a width of approximately 300 µm is used as mask films 2a and 2b. Conductive paste 4 is filled into through-holes 3 for electrically coupling.

Figure 4:
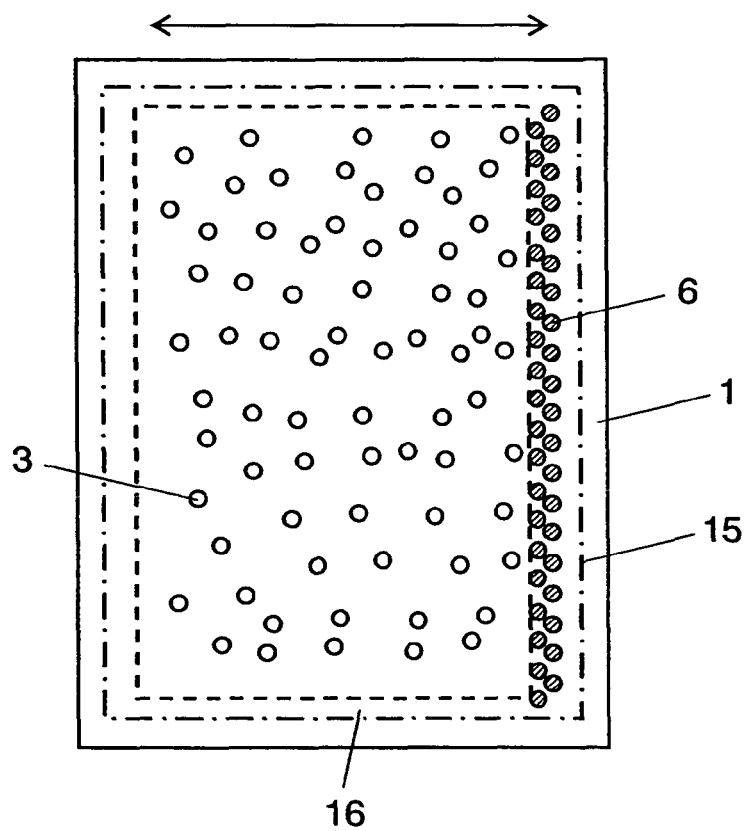
FIG. 4 is a plan view of the circuit board after forming a through-hole in the method for manufacturing the circuit board in accordance with the first exemplary embodiment of the present invention.

First, as shown in FIG. 1A, mask film 2a, where squeegee cleaning part 6 has been formed, is prepared. Squeegee cleaning part 6 has been formed of hound's-tooth through-holes of approximately 150 µm diameters by using a laser processing method at predetermined positions in advance. Mask film 2a serves as a mask film located at a side where paste is to be filled. At the same time, unprocessed mask film 2b is also prepared. Squeegee cleaning part 6 is formed of hound's-tooth through-holes by using a laser, however no-penetrated-holes or a linear groove may be used. Besides, inexpensive and easy-maintenance cutting edge may be used to form a linear no-penetrated groove. A penetrated or no-penetrated shape may be used. It is acceptable that surroundings of processed part at mask film 2a have swollen portions 7. A height of swollen portion 7 is preferably set not lower than 3 µm. If it is lower than 3 µm, an effect of removing paste bonded to an edge of a squeegee deteriorates. As an upper limit, a height, which exerts an effect of the present invention and does not adversely affect the printing process, is acceptable. In a case where hounds-tooth squeegee cleaning part 6 is formed, holes are preferably set without an interval in a moving direction of the squeegee. As an example of forming holes, as shown in FIG. 4, holes are formed in such a manner that adjacent lines of squeegee cleaning parts 6 do not have an interval in the moving direction of the squeegee. Besides, holes of adjacent lines of squeegee cleaning parts 6 may be formed so as to overlap each other in the moving direction of the squeegee. By using this method, paste bonded to the whole squeegee is removed entirely.

Figure 1B:
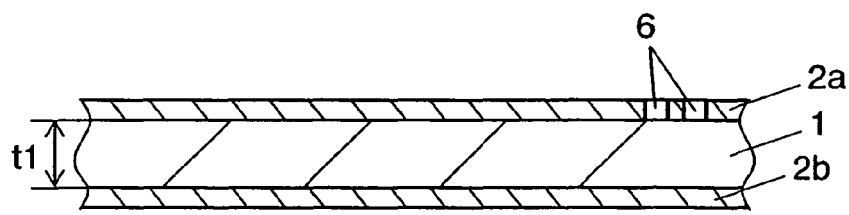
FIG. 1B is a sectional view showing a step of the method for manufacturing the circuit board in accordance with the first exemplary embodiment of the present invention.
Figure 2:
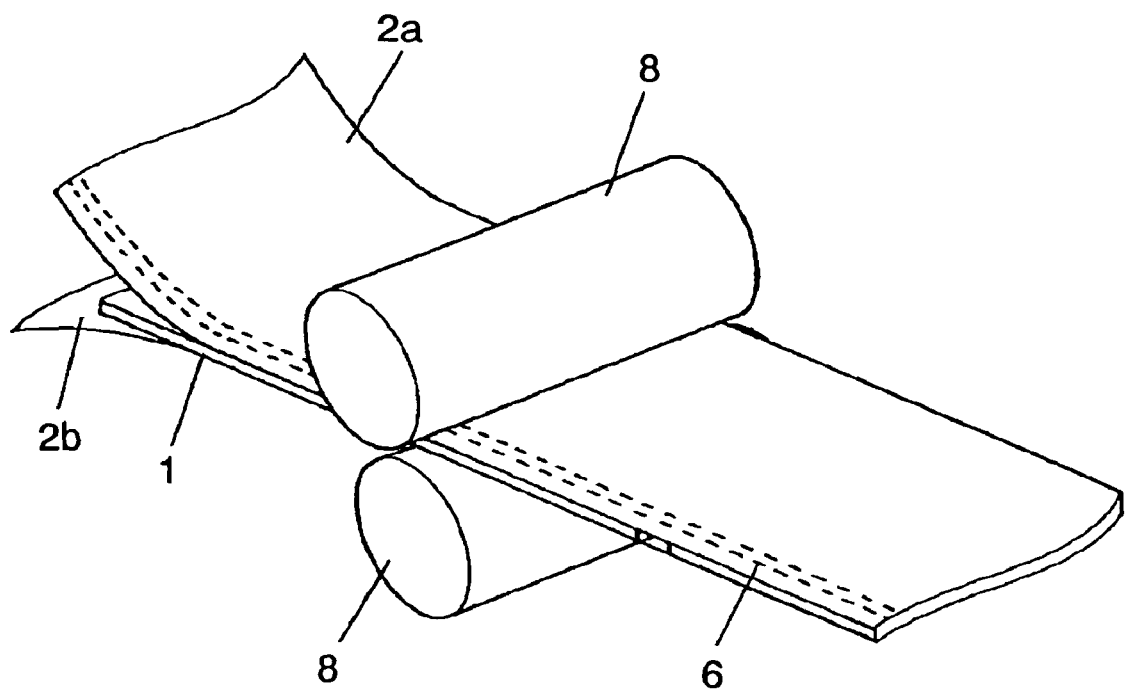
FIG. 2 is a schematic perspective view showing attaching a mask film in the method for manufacturing the circuit board in accordance with the first exemplary embodiment of the present invention.
Figure 3:
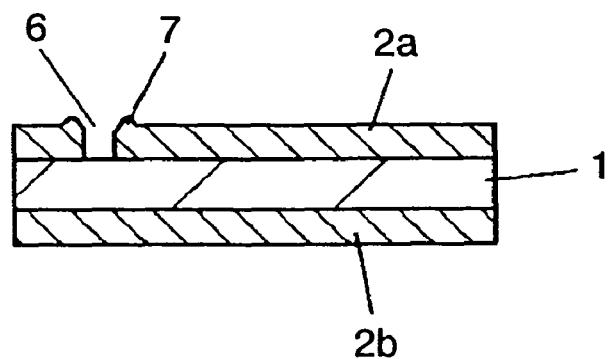
FIG. 3 is a partially sectional view of the circuit board after attaching a mask film in the method for manufacturing the circuit board in accordance with the first exemplary embodiment of the present invention.

Next, as shown in FIG. 1B and FIG. 2, a laminate apparatus is used for attaching prepreg sheet 1 to mask films 2a-2b. Resin ingredients of prepreg sheet 1 are melted by heating and pressing with heated laminate roll 8, so that mask films 2a and 2b are continuously bonded to prepreg sheet 1. As shown in FIG. 3, mask film 2a forming squeegee cleaning part 6 with through-holes having swollen portions 7 is attached to a side, where conductive paste 4 is to be filled, of prepreg sheet 1. Besides, unprocessed mask film 2b is attached to a back side of prepreg sheet 1.

Figure 1C:
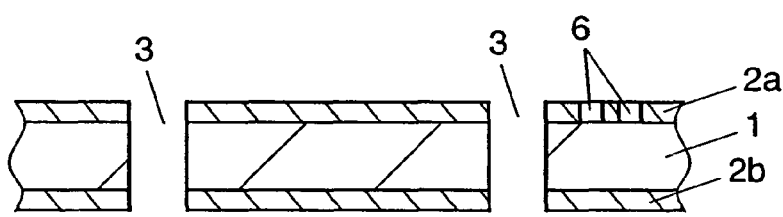
FIG. 1C is a sectional view showing a step of the method for manufacturing the circuit board in accordance with the first exemplary embodiment of the present invention.

Then, as shown in FIG. 1C, prepreg sheet 1 is positioned, and through-holes 3 of approximately 150 µm diameter are formed by using a laser such as a carbon dioxide laser for electrically coupling a front side of the product with a back side thereof. As shown in FIG. 4, necessary through-holes 3 are formed within product area 16. Squeegee cleaning part 6 is positioned out of product area 16, and within paste-filling area 15.

Figure 1D:
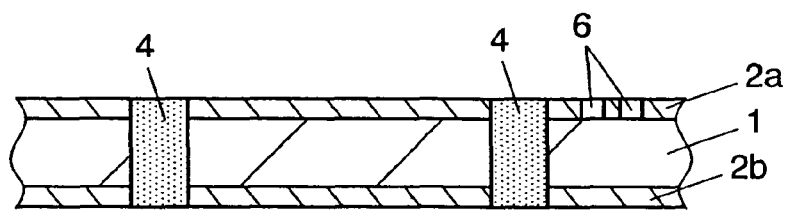
FIG. 1D is a sectional view showing a step of the method for manufacturing the circuit board in accordance with the first exemplary embodiment of the present invention.
Figure 1E:
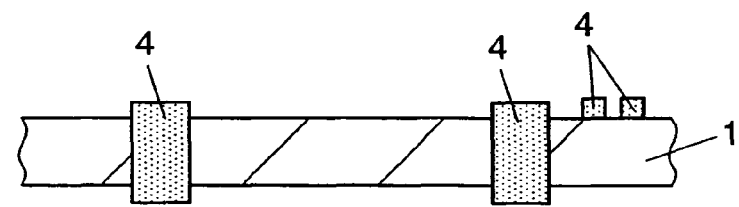
FIG. 1E is a sectional view showing a step of the method for manufacturing the circuit board in accordance with the first exemplary embodiment of the present invention.
Figure 5:
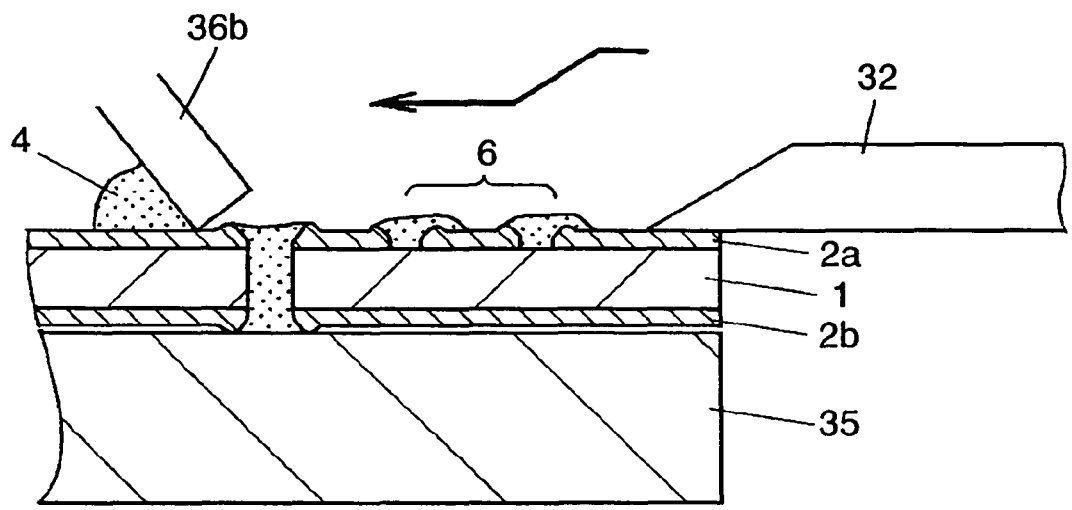
FIG. 5 is a partially sectional view of the circuit board in filling paste of the method for manufacturing the circuit board in accordance with the first exemplary embodiment of the present invention.

Next, as shown in FIG. 1D and FIG. 5, prepreg sheet 1 is positioned at stage 35 of a paste-filling machine in such a manner that a process for filling conductive paste 4 of backward-squeegee 36b at the paste-filling machine starts from squeegee cleaning parts 6 on prepreg sheet 1. Then conductive paste 4 is filled into through-holes 3.

The filling method is the same as the conventional one, so that the detailed descriptions are omitted here. According to the method for manufacturing the circuit board of the first embodiment, as shown in FIG. 5, when a process for filling conductive paste 4 is started by using backward-squeegee 36b, backward-squeegee 36b is contacted with squeegee cleaning part 6. Solid conductive paste 4, which has been formed at the squeegee edge, is removed, and a paste-residue occurs at squeegee cleaning part 6. However, after that, because the squeegee edge is cleaned, conductive paste 4 is not remained on through-holes 3 within the product. Therefore, conductive paste 4 is filled stably.

In addition, because squeegee cleaning part 6 penetrates only mask film 2a, conductive paste 4 is filled within only mask film 2a.

Then, as shown in FIG. 1, mask films 2a and 2b are removed from both surfaces of prepreg sheet 1. Conductive paste 4 of cleaning part 6, which does not adversely affect quality of connection, is partly removed to a side of mask films 2a and remained with unstable thickness. However, at through-holes 3 within the product, conductive paste 4 is not removed with mask films 2a, so that a stable amount of filling of paste can be secured.

The following steps are the same as the conventional one, so that the drawings are omitted here. After that, metals such as copper are piled at both sides of prepreg sheet 1, and heated and pressed with a heat press in this state. As a result, a thickness of prepreg sheet 1 decreases, and prepreg sheet 1 and the metal foils are bonded. Thus, metals at both sides are electrically coupled with each other by using conductive paste 4 filled in through-holes 3 formed at a certain position.

One hundred prepreg sheets 1, where conductive pastes 4 are filled in through-holes 3, are inspected, and the following effect is confirmed. A paste-residue is not remained at through-holes 3 within the product after passing squeegee cleaning part 6. Moreover, even when mask films 2a and 2b are removed, adverse affect, which occurs by removing conductive paste 4 with mask films 2a and 2b in the conventional method and effects on quality, does not occur.

When the through-holes of squeegee cleaning part 6 are formed in hound's-tooth shape and each through-hole is formed with an interval so as not to overlap each other, removed conductive pastes 4 are remained on all through-holes in the same manner as through-holes are overlapped. Paste is not removed at the interval between through-holes, and may remain on through-holes 3 within the product.

Second Exemplary Embodiment

Second exemplary embodiment is demonstrated with reference to FIG. 6 through FIG. 9. According to FIG. 6 through FIG. 9, prepreg sheet 1 has a size of 300 mm×500 mm and a thickness of approximately 150 μm. A substrate is formed of a composite which is wholly aromatic polyamide fiber of nonwoven fabric impregnated with thermosetting epoxy resin. PET having a thickness of approximately 20 μm and a width of approximately 300 μm is used as mask films 2a and 2b. Metal foils 25a and 25b such as copper of 35 cm thickness are attached to both sides of prepreg sheet 1. Conductive paste 4 is filled into through-holes 3 for electrically coupling.

Figure 6A:
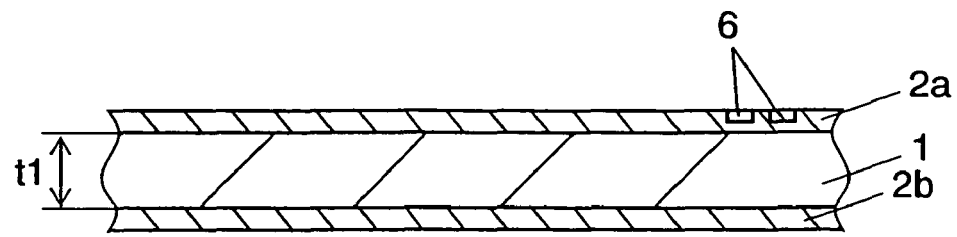
FIG. 6A is a sectional view showing a step of a method for manufacturing a circuit board in accordance with a second exemplary embodiment of the present invention.
Figure 7:
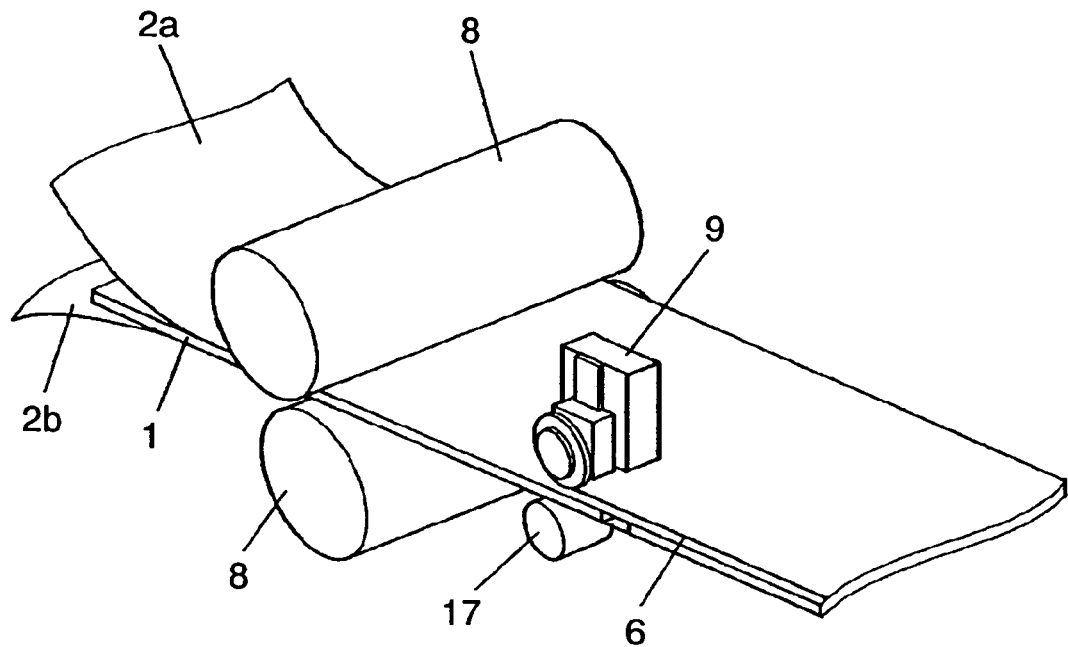
FIG. 7 is a schematic perspective view showing attaching a mask film and forming a squeegee cleaning part in the method and an apparatus for manufacturing the circuit board in accordance with the second exemplary embodiment of the present invention.

A method for manufacturing a circuit board of the present invention is described hereinafter. As shown in FIG. 6A and FIG. 7, a laminate apparatus is used for attaching prepreg sheet 1 to mask films 2a-2b. Resin ingredients of prepreg sheet 1 are melted by heating and pressing with heated laminate roll 8, so that mask films 2a and 2b are continuously bonded to prepreg sheet 1 at a speed of approximately 2 m/min.

After, mask films 2a and 2b are attached to prepreg sheet 1 by using laminate roll 8, mask film 2a is continuously cut by using groove processing section 9 in a no-penetrating state. As a result, one linear groove is processed, thereby forming squeegee cleaning part 6.

Figure 8:
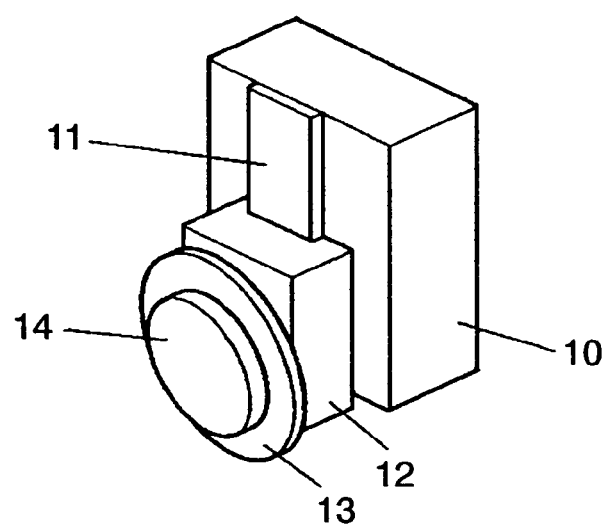
FIG. 8 is a schematic perspective view showing a groove processing section for forming a squeegee cleaning part in the method and an apparatus for manufacturing the circuit board in accordance with the second exemplary embodiment of the present invention.
Figure 9:
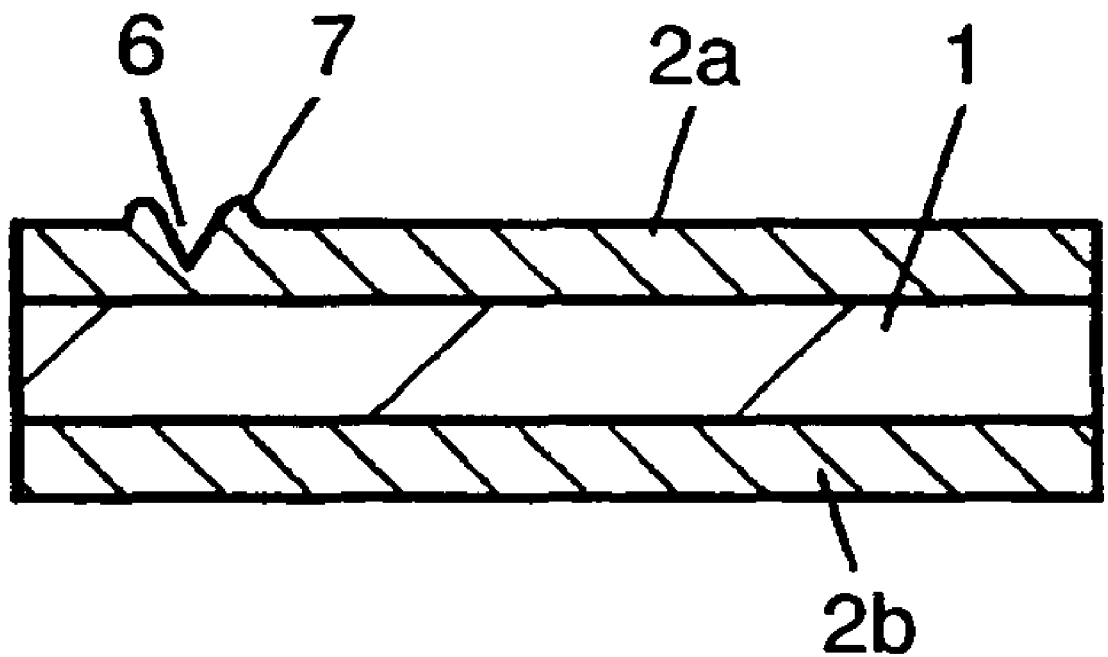
FIG. 9 is a partially sectional view of the circuit board after attaching a mask film and forming squeegee cleaning part 6 in the method for manufacturing the circuit board in accordance with the first exemplary embodiment of the present invention.
Figure 10A:
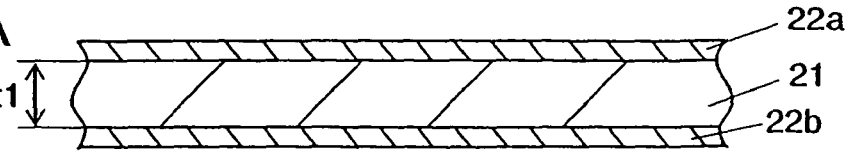
FIG. 10A is a sectional view showing a step of a conventional method for manufacturing a double-sided circuit board.
Figure 10B:
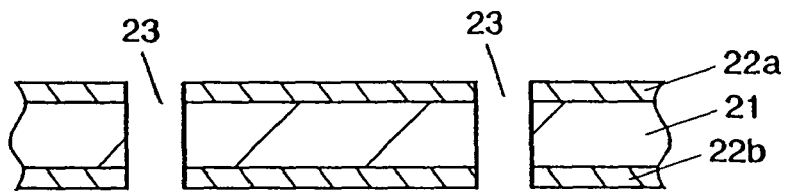
FIG. 10B is a sectional view showing a step of the conventional method for manufacturing the double-sided circuit board.
Figure 10C:
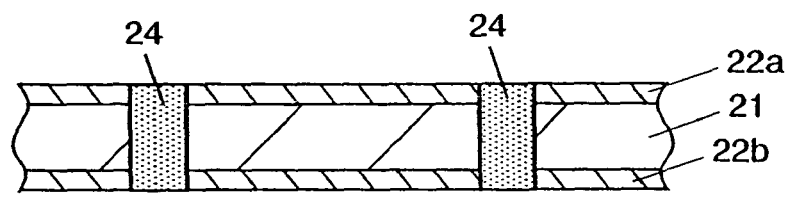
FIG. 10C is a sectional view showing a step of the conventional method for manufacturing the double-sided circuit board.
Figure 10D:
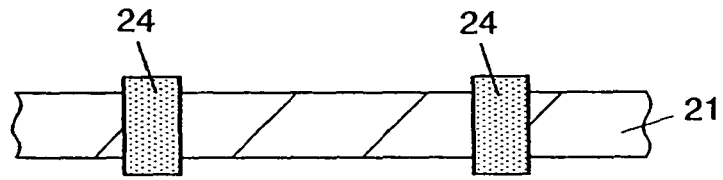
FIG. 10D is a sectional view showing a step of the conventional method for manufacturing the double-sided circuit board.
Figure 10E:
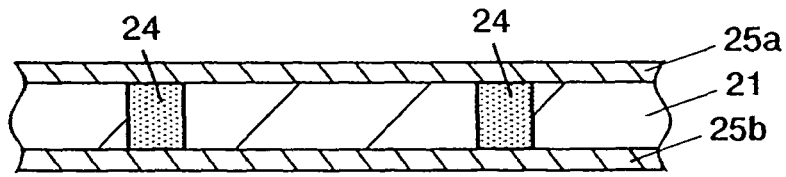
FIG. 10E is a sectional view showing a step of the conventional method for manufacturing the double-sided circuit board.
Figure 10F:
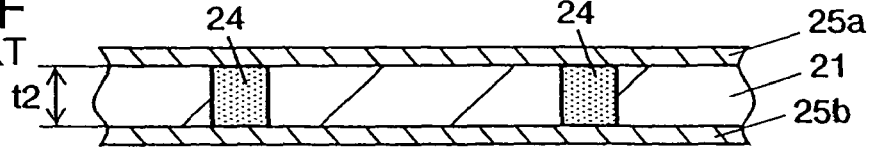
FIG. 10F is a sectional view showing a step of the conventional method for manufacturing the double-sided circuit board.
Figure 11:
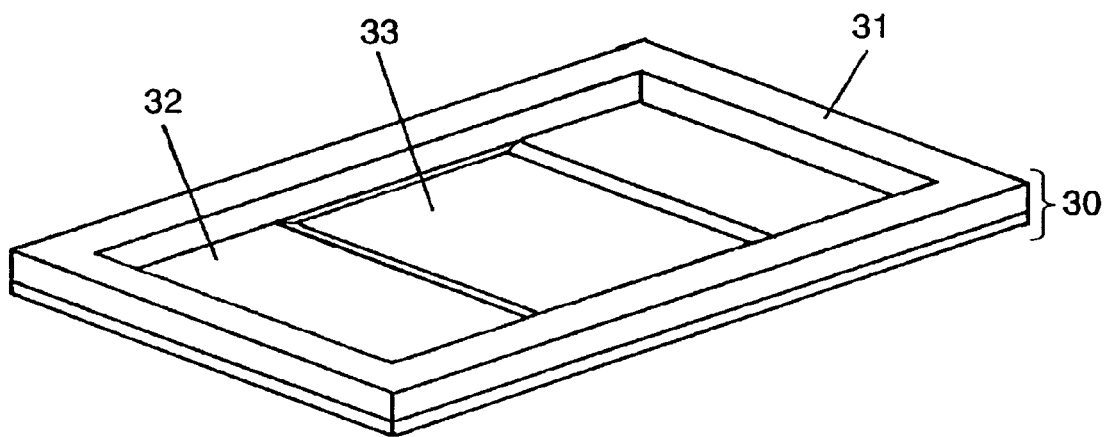
FIG. 11 is a perspective view showing a conventional frame of a printing plate fixing a mask having an opening.
Figure 12:
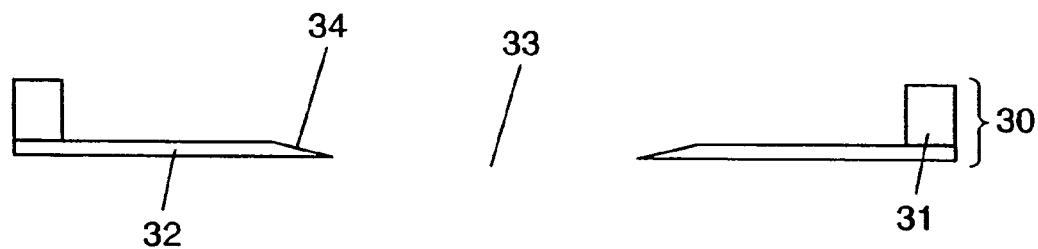
FIG. 12 is a sectional view showing the conventional frame of the printing plate fixing the mask having the opening.
Figure 13A:
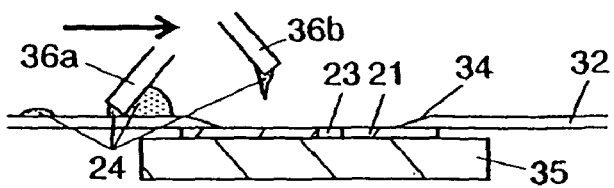
FIG. 13A is a sectional view showing a step of filling paste in a conventional squeezing method.
Figure 13B:
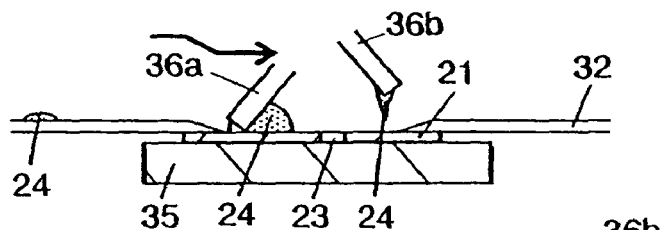
FIG. 13B is a sectional view showing a step of filling paste in the conventional squeezing method.
Figure 13C:
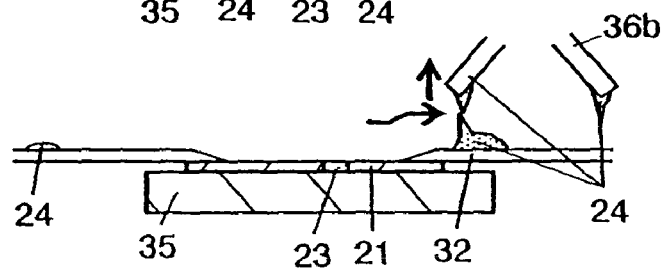
FIG. 13C is a sectional view showing a step of filling paste in the conventional squeezing method.
Figure 13D:
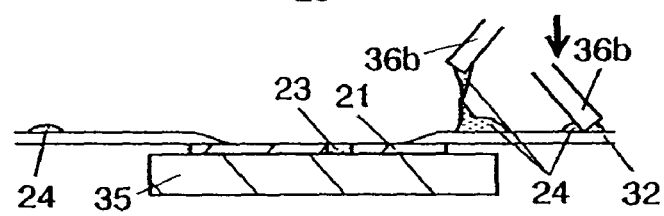
FIG. 13D is a sectional view showing a step of filling paste in the conventional squeezing method.
Figure 13E:
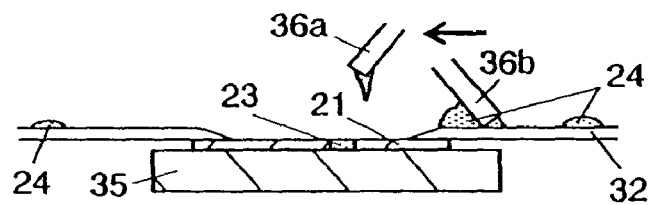
FIG. 13E is a sectional view showing a step of filling paste in the conventional squeezing method.
Figure 13F:
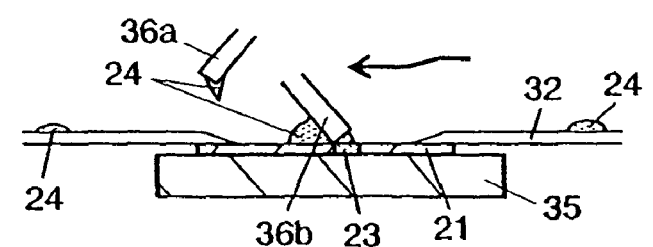
FIG. 13F is a sectional view showing a step of filling paste in the conventional squeezing method.
Figure 13G:
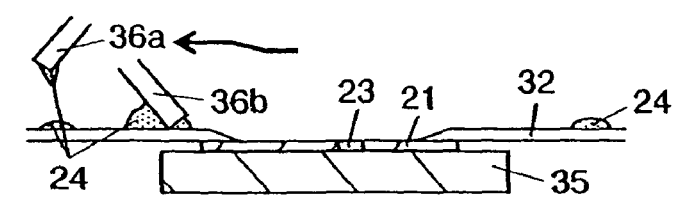
FIG. 13G is a sectional view showing a step of filling paste in the conventional squeezing method.
Figure 14:
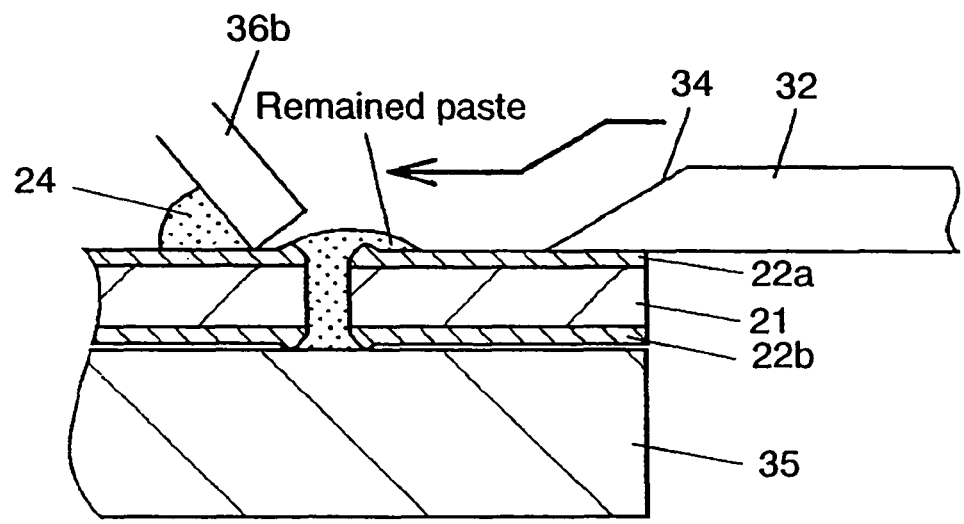
FIG. 14 is a partially sectional view of the conventional circuit board while paste is filled.
Figure 15:
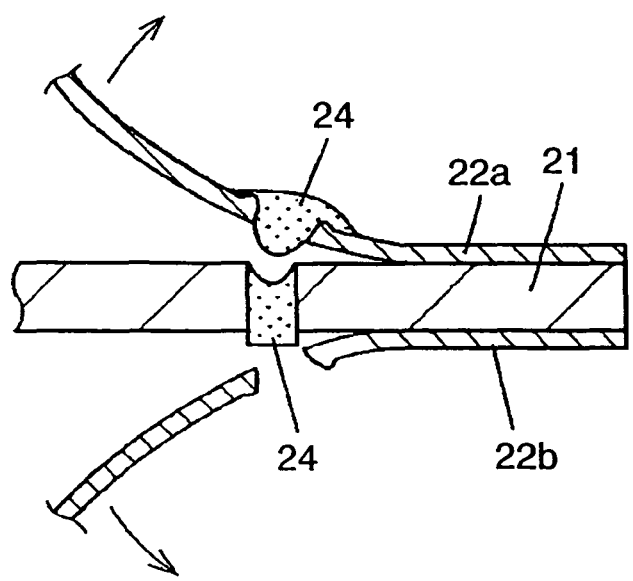
FIG. 15 is a partially sectional view of the conventional circuit board while a mask film is peeled.

Backing roll 17 of round blade 13 rotates for preventing prepreg sheet 1 from being injured in groove processing, however, if it has a scratchproof smooth surface, rotation may be stopped or a flat plate may be acceptable. One linear groove is demonstrated in this embodiment, however, if a plurality of grooves is formed, they can accommodate variations of positional deviation for prepreg sheet 1 in forming squeegee cleaning part 6 or filling paste. Therefore, squeegee cleaning effect can be furthermore secured. As shown in FIG. 8, groove processing section 9 is formed of round blade 13, blade-fixing screw 14, blade-fixing section 12 and blade-fixing-section-installing unit 10 having sliding section 11. Round blade 13 is made of super steel whose diameter is 20 mm, plate thickness is 300 μm and edge angle is 60 degrees. Blade-fixing screw 14 is used for fixing round blade 13. Round blade 13 is fixed to blade-fixing section 12 by using blade-fixing screw 14 not to rotate. Blade-fixing section 12 slides up and down at sliding section 11 of blade-fixing-section-installing unit 10. As shown in FIG. 8, backing roll 17 of round blade 13 rotates for preventing prepreg sheet 1 from being injured in groove processing, however, if it has a scratchproof smooth surface, rotation may be stopped or a flat plate may be acceptable. Gross weight of a movable part is controlled and processed in such a manner that load of fixing blade 13 becomes approximately 140 g. As a result, as shown in FIG. 9, a no-penetrated linear groove having a depth of approximately 10 μm and swollen portion 7, whose height is approximately 61 μm, can be obtained, so that squeegee cleaning part 6 is formed.

A depth of the groove or a height of swollen portion 7 can be controlled by adjusting a depth of the groove using depressing level of mask film 2a or lord for round blade 13 in cutting with the edge angle of round blade 13. It is confirmed by experiments that the edge angle is preferably set 30-90 degrees, and the lord for round blade 13 is preferably set in such a manner that mask films 2a and 2b are not broken in removing after conductive paste 4 is filled, and swollen portion 7 is not lower than 3 μm.

Squeegee cleaning parts 6 are formed at predetermined positions of prepreg sheet 1. Therefore, according to the first embodiment, because mask film 2a is processed beforehand, prepreg sheet 1 has to be positioned to mask film 2a precisely every time mask film 2a is changed. However, according to the present embodiment, prepreg sheet 1 is positioned to groove processing section 9 once, so that precise positioning is unnecessary at every changing of mask film 2a. According to the present embodiment, squeegee cleaning part 6 is formed by using round blade 13. However, squeegee cleaning part 6 may be formed of a no-penetrated groove processing, hound's-tooth circle processing or hound's-tooth through-holes by using a laser.

In a case where squeegee cleaning part 6 is formed of hound's-tooth type, in the same way as the first embodiment, adjacent holes are preferably formed so as to contact or overlap each other to remove all paste bonded to the whole squeegee.

Figure 6B:
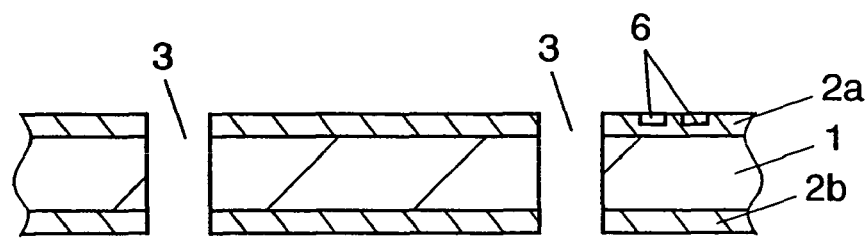
FIG. 6B is a sectional view showing a step of the method for manufacturing the circuit board in accordance with the second exemplary embodiment of the present invention.

Next, as shown in FIG. 6B, prepreg sheet 1 is positioned, and in the same way as the first embodiment, through-holes 3 are formed by using a laser such as a carbon dioxide laser for electrically coupling a front side of the product with a back side thereof.

Figure 6C:
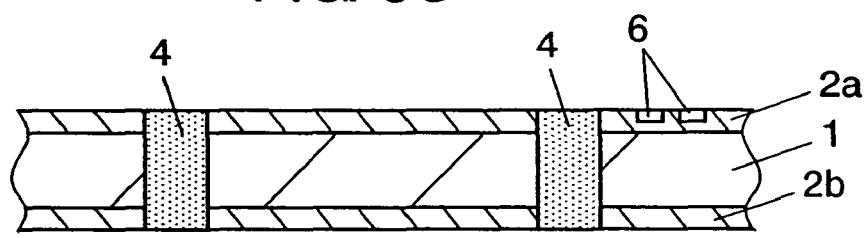
FIG. 6C is a sectional view showing a step of the method for manufacturing the circuit board in accordance with the second exemplary embodiment of the present invention.

Then, as shown in FIG. 6C, in the same way as the first embodiment, conductive paste 4 is filled into through-holes 3 by using a paste-filling machine. Setting of prepreg sheet 1 is the same as that in the first embodiment, and a filling method is the same as that in the conventional example, so that the detailed descriptions are omitted here.

According to the method for manufacturing a circuit board of the second embodiment, in the same way as the first embodiment, solid conductive paste 4, which has been formed at the squeegee edge, is removed, and a paste-residue occurs at squeegee cleaning part 6. However, after that, because the squeegee edge is cleaned, conductive paste 4 is not remained on through-holes 3 within the product. Therefore, conductive paste 4 is filled stably. In addition, squeegee cleaning part 6 is formed by no-penetrated groove processing of mask film 2a, so that conductive paste 4 is filled into a depth of the groove in mask film 2b.

Figure 6D:
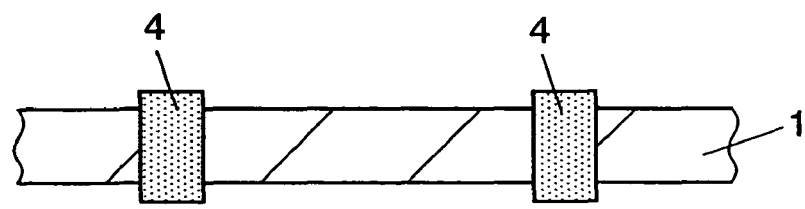
FIG. 6D is a sectional view showing a step of the method for manufacturing the circuit board in accordance with the second exemplary embodiment of the present invention.

As shown in FIG. 6D, mask films 2a and 2b are removed from both sides of prepreg sheet 1. Squeegee cleaning part 6 is formed by no-penetrated groove processing of mask film 2a, so that conductive paste 4 does not reach a surface of prepreg sheet 1. As a result, unnecessary paste does not remain on prepreg sheet 1 in peeling, and paste in through-holes 3 within the product is not removed with mask film 2a, so that a stable amount of filling of paste can be secured.

The following steps are the same as the conventional one, so that the drawings are omitted here. After that, metals such as copper are piled at both sides of prepreg sheet 1, and heated and pressed with a heat press in this state. As a result, a thickness of prepreg sheet 1 is compressed, and prepreg sheet 1 and the metal foils are bonded. Thus, metals at both sides are electrically coupled with each other by using conductive paste 4 filled in through-holes 3 formed at a certain position. One hundred prepreg sheets 1, where conductive pastes 4 are filled in through-holes 3, are inspected, and the following effect is confirmed. As the first embodiment, a paste-residue is not remained at through-holes 3 within the product after passing squeegee cleaning part 6. Moreover, even when mask films 2a and 2b are removed, adverse affect, which occurs by removing conductive paste 4 with mask films 2a and 2b in the conventional method and effects on quality, does not occur.

In the first and second embodiments, squeegee cleaning part 6 is formed at a side of prepreg sheet 1 which is a side of starting of last operation of a squeegee. However, it may be also formed at other side of prepreg sheet 1.

According to the first and second embodiments, a member where resin material, whose main body is thermosetting resin, is impregnated into nonwoven fabric, whose main body is aramid fiber, thereby forming B-stage is used as the substrate. However, it is needless to say that the same effect can be obtained by using aramid fabric, fabric of glass fiber or nonwoven fabric as the fiber. Resin material, whose main body is aramid fiber or glass fiber, is superior in thermal resistance and mechanical-physical properties. Particularly, aramid fiber is advantageous in lightweight.

By using prepreg material of B-stage state, miniaturization of through-hole 3 by using laser processing can be realized and a conductive hole can be formed by filling conductive paste 4 into through-hole 3. Particularly, according to the present invention, stable conductive connection can be performed.

According to the method and the apparatus for manufacturing of the present invention, high viscous paste of a squeegee edge is removed at the squeegee cleaning part on a circuit board before paste is filled in a through-hole of the circuit board. Thus, a high viscous paste-residue can be prevented on the through-hole of the product, so that a circuit board having high quality can be provided.

INDUSTRIAL APPLICABILITY

According to a method for manufacturing and printing a circuit board of the present invention, in a case where both sides of the circuit board or layers of a multilayer wiring board are electrically coupled by using conductive paste, trouble which occurs in a conventional method when the conductive paste is filled into a through-hole is dissolved, so that quality of connection can be stable. This method can be applied to a general circuit board which is necessary for filling conductive paste into a through-hole or a no-penetrated-hole by using a mask film.

The invention claimed is:

1. A method for manufacturing a circuit board comprising:
    attaching a mask film to a substrate in at least one squeegee area, the mask film including a first surface opposite a surface attached to the substrate;
    forming a plurality of depressions in the first surface in the at least one squeegee area, each depression surrounded by a respective periphery having an elevation higher than an elevation of the first surface;
    forming a through-hole through the mask film and the substrate in the at least one squeegee area; filling conductive paste into the through-hole by using a squeezing operation in the at least one squeegee area; and
    cleaning a squeegee using the formed plurality of depressions during the squeezing operation.

2. A method for manufacturing a circuit board comprising:
    attaching a mask film to a substrate in at least one squeegee area, the mask film including a first surface opposite a surface attached to the substrate;
    forming a squeegee cleaning part at the first surface in the at least one squeegee area, the squeegee cleaning part having a plurality of depressions in the first surface, each depression surrounded by a respective periphery having an elevation higher than an elevation of the first surface;
    forming a through-hole through the substrate and the mask film in the at least one squeegee area;
    filling conductive paste into the through-hole by using a squeezing operation in the at least one squeegee area; and
    cleaning a squeegee using the squeegee cleaning part during the squeezing operation,
    wherein the squeegee cleaning part is formed at a predetermined position in the mask film before the filling of the conductive paste.

3. The method for manufacturing a circuit board of claim 1, wherein the plurality of depressions are formed at a position which is not used to form a portion of the circuit board or an area outside of a product area of a paste-filling area of the mask film and within a printing range.

4. The method for manufacturing a circuit board of claim 1, wherein each depression is a through-hole formed in the mask film.

5. The method for manufacturing a circuit board of claim 1, wherein each depression is a linear groove formed at a paste-filling area of the mask film, the linear groove being formed so as not to penetrate through the substrate.

6. The method for manufacturing a circuit board of claim 5, wherein the forming of each linear groove of the mask film includes processing the linear groove using a cutting edge.

7. The method for manufacturing a circuit board of claim 6, wherein the cutting edge is a round blade.

8. The method for manufacturing a circuit board of claim 7, wherein the round blade is fixed to a blade-fixing section having vertically sliding function with a certain load so as not to rotate.

9. The method for manufacturing a circuit board of claim 8, further comprising setting a depth of the linear groove and the elevation of the perimeter portion of the plurality of depressions by adjusting an edge angle of the round blade and a load.

10. The method for manufacturing a circuit board of claim 1,
wherein the elevation of the perimeter portion of each depression is above the first surface by 3 μm or more.

11. The method for manufacturing a circuit board of claim 1,
wherein the substrate is a prepreg where resin material, whose main body is thermosetting resin, is impregnated into a fabric or a nonwoven fabric, thereby forming B-stage.

12. The method for manufacturing a circuit board of claim 11,
wherein aramid fabric is the main body of the fabric or the nonwoven fabric.

13. The method for manufacturing a circuit board of claim 11,
wherein glass fiber is the main body of the fabric or the nonwoven fabric.

14. The method for manufacturing a circuit board of claim 1, wherein:
the filling of the conductive paste into the through-hole by using the squeezing operation comprises:
filling the conductive paste into the through-hole by reciprocating the squeegee on the circuit board; and
the cleaning of the squeegee using the formed plurality of depressions during the squeezing operation includes cleaning an edge of the squeegee by using the plurality of depressions.

15. The method for manufacturing a circuit board of claim 2,
wherein the predetermined position is a position which is not used to form a portion of the circuit board or an area outside of a product area of a paste-filling area of the mask film and within a printing range.

16. The method for manufacturing a circuit board of claim 2,
wherein the squeegee cleaning part is a linear groove formed at a paste-filling area of the mask film, the linear groove being formed so as not to penetrate through the substrate.

17. The method for manufacturing a circuit board of claim 16,
wherein the squeegee cleaning part is a plurality of the linear grooves.

18. The method for manufacturing a circuit board of claim 16,
wherein the forming of the linear groove of the mask film includes processing the linear groove using a cutting edge.

19. The method for manufacturing a circuit board of claim 18,
wherein the cutting edge is a round blade.

20. The method for manufacturing a circuit board of claim 19,
wherein the round blade is fixed to a blade-fixing section having vertically sliding function with a certain load so as not to rotate.

21. The method for manufacturing a circuit board of claim 20, further comprising setting a depth of the linear groove and the elevation of the perimeter portion of the squeegee cleaning part by adjusting an edge angle of the round blade and the load.

22. The method for manufacturing a circuit board of claim 2,
wherein the elevation of the perimeter portion is above the first surface by 3 μm or more.

23. The method for manufacturing a circuit board of claim 2,
wherein the substrate is a prepreg where resin material, whose main body is thermosetting resin, is impregnated into a fabric or a nonwoven fabric, thereby forming B-stage.

24. The method for manufacturing a circuit board of claim 23,
wherein aramid fabric is the main body of the fabric or the nonwoven fabric.

25. The method for manufacturing a circuit board of claim 23,
wherein glass fiber is the main body of the fabric or the nonwoven fabric.

26. The method for manufacturing a circuit board of claim 2,
wherein the filling of the conductive paste into the through-hole by using the squeezing operation comprises:
filling the conductive paste into the through-hole by reciprocating the squeegee on the circuit board; and
the cleaning of the squeegee includes cleaning an edge of the squeegee by using the squeegee cleaning part.

* * * * *